US010868271B2

United States Patent
Nishizaki et al.

(10) Patent No.: US 10,868,271 B2
(45) Date of Patent: Dec. 15, 2020

(54) ORGANIC LIGHT-EMITTING DISPLAY APPARATUS AND MANUFACTURING METHOD THEREOF

(71) Applicant: Samsung Display Co., Ltd., Yongin-Si (KR)

(72) Inventors: Shogo Nishizaki, Yongin-si (KR); Jaehyun Kim, Yongin-si (KR); Daesang Yun, Yongin-si (KR); Soyeon Jeong, Yongin-si (KR)

(73) Assignee: Samsung Display Co., Ltd.

( * ) Notice: Subject to any disclaimer, the term of this patent is extended or adjusted under 35 U.S.C. 154(b) by 36 days.

(21) Appl. No.: 16/103,782

(22) Filed: Aug. 14, 2018

(65) Prior Publication Data

US 2019/0140211 A1    May 9, 2019

(30) Foreign Application Priority Data

Nov. 8, 2017    (KR) .................. 10-2017-0148323

(51) Int. Cl.
*H01L 51/52* (2006.01)
*H01L 51/56* (2006.01)
*H01L 27/32* (2006.01)

(52) U.S. Cl.
CPC .......... *H01L 51/5253* (2013.01); *H01L 51/56* (2013.01); *H01L 27/3244* (2013.01); *H01L 2251/5338* (2013.01); *H01L 2251/558* (2013.01)

(58) Field of Classification Search
CPC ............ H01L 51/5237; H01L 51/5253; H01L 51/5256; H01L 51/56; H01L 2251/558; H01L 2251/5338; H01L 27/3244; H01L 23/16

See application file for complete search history.

(56) References Cited

U.S. PATENT DOCUMENTS

| 9,048,455 | B2 | 6/2015 | Lee |
| 2012/0256201 | A1 | 10/2012 | Lee et al. |
| 2014/0183462 | A1 | 7/2014 | Lee et al. |
| 2017/0018737 | A1 | 1/2017 | Kim et al. |
| 2017/0098798 | A1* | 4/2017 | Park .................... H01L 51/5253 |

FOREIGN PATENT DOCUMENTS

| KR | 10-2012-0113555 A | 10/2012 |
| KR | 10-2014-0038113 A | 3/2014 |
| KR | 10-2014-0088335 A | 7/2014 |
| KR | 10-2017-0010285 A | 1/2017 |
| KR | 10-2017-0050847 A | 5/2017 |

* cited by examiner

*Primary Examiner* — Thanhha S Pham
(74) *Attorney, Agent, or Firm* — Innovation Counsel LLP

(57) ABSTRACT

An organic light-emitting display apparatus includes: a first inorganic film covering a display unit; and an organic film on the first inorganic film, wherein a plurality of protrusions are distributed over a surface of the first inorganic film contacting the organic film.

10 Claims, 7 Drawing Sheets

ORGANIC LIGHT-EMITTING DISPLAY APPARATUS AND MANUFACTURING METHOD THEREOF

CROSS-REFERENCE TO RELATED APPLICATION

This application claims the benefit of Korean Patent Application No. 10-2017-0148323, filed on Nov. 8, 2017, in the Korean Intellectual Property Office, the disclosure of which is incorporated herein in its entirety by reference.

BACKGROUND

1. Field

One or more embodiments relate to an organic light-emitting display apparatus including a thin film encapsulation layer, and a method of manufacturing the organic light-emitting display apparatus.

2. Description of the Related Art

In general, organic light-emitting display apparatuses include a display unit having a structure in which an emission layer including an organic material is between an anode and a cathode. When voltage is applied to each of the anode and the cathode, a hole injected from the anode and an electron injected from the cathode recombine in the emission layer and thus generate an exciton. When the exciton changes from an excited state to a ground state, emission occurs, and at the same time, an image is displayed.

In addition, when the emission layer of the display unit directly contacts moisture, emission characteristics thereof may be degraded, and accordingly, to prevent this, an encapsulation member is used to cover the display unit, and recently, a thin film encapsulation layer in which an organic film and an inorganic film are alternately stacked has been mostly used as the encapsulation member. The inorganic film from among the stacked films of the thin film encapsulation layer mainly prevents penetration of moisture into the display unit, and the organic film planarizes unevenness of a lower layer thereof and provides flexibility.

SUMMARY

Recently, as foldable or bendable display apparatuses are demanded, there is necessity of forming an organic film of a thin film encapsulation layer to be as thin as possible. However, when the organic film is unconditionally formed thin, the organic film may not sufficiently spread for planarization, and thus, an unfilled region where the organic film is not present may be intermittently formed. As a result, layers end up unevenly stacked on the organic film where the unfilled region is present, which may lead to product defects in the end.

One or more embodiments include an organic light-emitting display apparatus improved to variously change a thickness of an organic film of a thin film encapsulation layer, and at the same time, control the occurrence of an unfilled region, and a method of manufacturing the organic light-emitting display apparatus.

Additional aspects will be set forth in part in the description which follows and, in part, will be apparent from the description, or may be learned by practice of the presented embodiments.

According to one or more embodiments, an organic light-emitting display apparatus includes: a substrate; a display unit on the substrate; and a thin film encapsulation layer covering the display unit, wherein the thin film encapsulation layer includes: a first inorganic film on the display unit; and an organic film on the first inorganic film, wherein a plurality of protrusions are distributed over a surface of the first inorganic film contacting the organic film.

A surface roughness of the first inorganic film may range between 1 nm RMS and 50 nm RMS due to the plurality of protrusions.

The surface roughness of the first inorganic film and a thickness of the organic film may satisfy a condition of $Y=96.54 \exp(-0.248 \cdot X)$, where Y is the surface roughness of the first inorganic film in nm and X is the thickness of the organic film in μm.

The first inorganic film may include a base layer contacting the display unit, and a surface layer on the base layer, wherein the surface layer may contact the organic film and may be an object of the surface roughness.

The surface roughness of the surface layer may include a same pattern as roughness of the base layer.

The roughness of the base layer may be determined by an uneven state of a body surface of the base layer.

The organic light-emitting display apparatus may further include a roughness auxiliary layer including fine particles distributed over the base layer, wherein the roughness of the base layer may be determined by the fine particles of the roughness auxiliary layer.

The surface layer may include an independent surface roughness including a different pattern from roughness of the base layer.

The surface roughness of the surface layer may be determined by an uneven state of a body surface of the surface layer.

The organic light-emitting display apparatus may further include a roughness auxiliary layer including fine particles distributed over the surface layer, wherein the surface roughness of the surface layer may be determined by the fine particles of the roughness auxiliary layer.

The thin film encapsulation layer may further include a second inorganic film on the organic film.

According to one or more embodiments, a method of manufacturing an organic light-emitting display apparatus includes: forming, on a substrate, a display unit which displays an image; and forming a thin film encapsulation layer covering the display unit, wherein the forming of the thin film encapsulation layer includes: forming a first inorganic film on the display unit; forming an organic film on the first inorganic film; and distributing a plurality of protrusions over a surface of the first inorganic film contacting the organic film.

A surface roughness of the first inorganic film may range between 1 nm RMS and 50 nm RMS due to the plurality of protrusions.

The surface roughness of the first inorganic film and a thickness of the organic film may satisfy a condition of $Y=96.54 \exp(-0.248 \cdot X)$, where Y is the surface roughness of the first inorganic film in nm and X is the thickness of the organic film in μm.

The forming of the first inorganic film may include forming a base layer contacting the display unit, and forming a surface layer on the base layer, wherein the surface layer may contact the organic film and may be an object of the surface roughness.

The surface roughness of the surface layer may include a same pattern as roughness of the base layer.

The roughness of the base layer may be formed in an uneven state of a body surface of the base layer.

The method may further include forming a roughness auxiliary layer by distributing fine particles over the base layer, wherein the roughness of the base layer may be formed by the fine particles of the roughness auxiliary layer.

The surface layer may include an independent surface roughness comprising a different pattern from roughness of the base layer.

The surface roughness of the surface layer may be formed in an uneven state of a body surface of the surface layer.

The method may further include forming a roughness auxiliary layer by distributing fine particles over the surface layer, wherein the surface roughness of the surface layer may be formed by the fine particles of the roughness auxiliary layer.

The method may further include forming a second inorganic film on the organic film.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
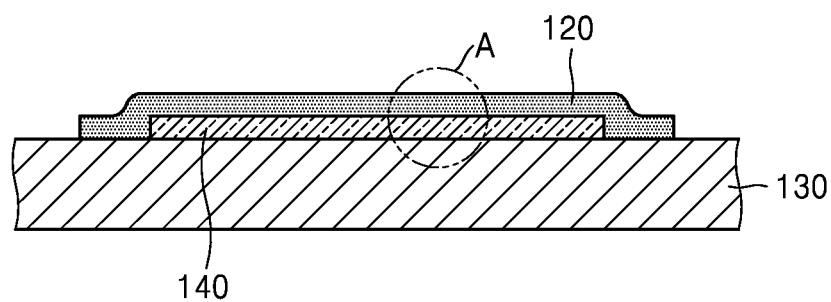
FIG. 1 is a schematic cross-sectional view of an organic light-emitting display apparatus according to an embodiment.

As the present disclosure allows for various changes and numerous embodiments, certain embodiments will be illustrated in the drawings and described in detail in the written description. Effects and features of the present disclosure and methods of accomplishing the same may be understood more readily by reference to the following detailed description of embodiments and the accompanying drawings. The present disclosure may, however, be embodied in many different forms and should not be construed as being limited to the embodiments set forth herein.

Hereinafter, embodiments of the present disclosure will be described in detail with reference to the accompanying drawings. Like reference numerals in the drawings denote like elements, and thus, a repeated description thereof will be omitted.

The singular forms "a," "an," and "the" used herein are intended to include the plural forms as well, unless the context clearly indicates otherwise.

It will be understood that the terms such as "include," "comprise," and "have" used herein specify the presence of stated features or components, but do not preclude the presence or addition of one or more other features or components.

Sizes of components in the drawings may be exaggerated for convenience of explanation. In other words, since sizes and thicknesses of components in the drawings are arbitrarily illustrated for convenience of explanation, the present disclosure is not limited thereto.

When an embodiment may be implemented differently, a specific process order may be performed differently from the described order. For example, two consecutively described processes may be performed substantially at the same time or performed in an order opposite to the described order.

Figure 2:
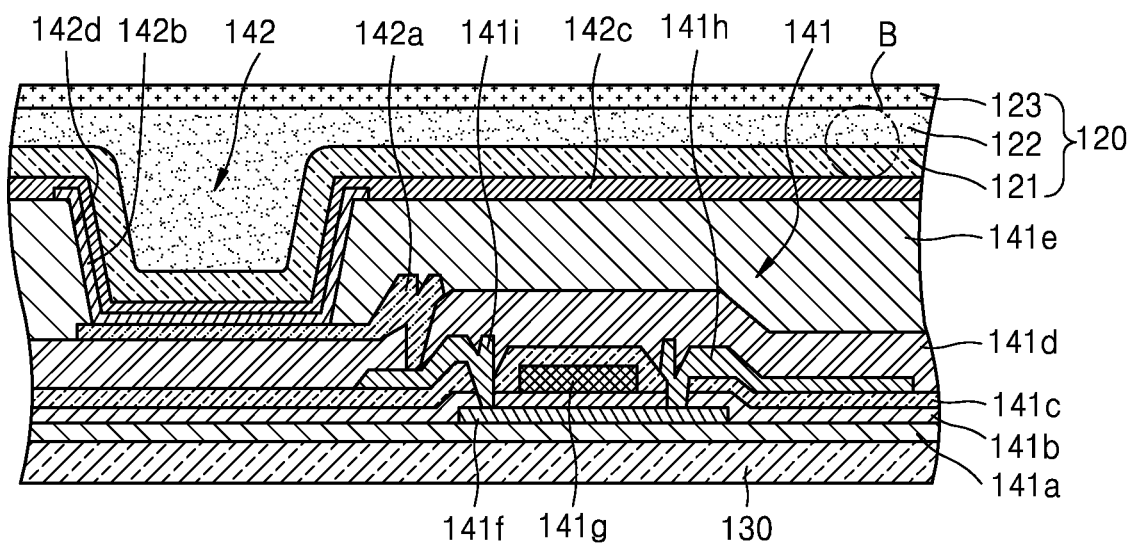
FIG. 2 is an enlarged cross-sectional view of part A of FIG. 1.
Figure 3A:
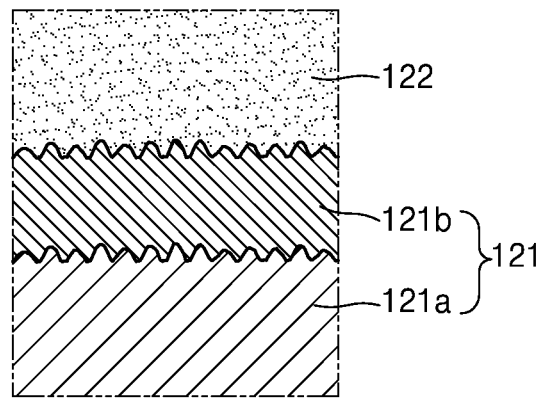
FIGS. 3A and 3B are enlarged cross-sectional views of part B of FIG. 2.
Figure 3B:
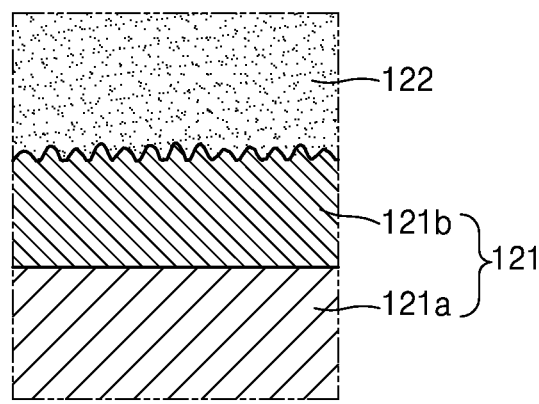

FIG. 1 is a cross-sectional view of an organic light-emitting display apparatus including a thin film encapsulation layer 120. FIG. 2 is an enlarged cross-sectional view of part A of FIG. 1. FIGS. 3A and 3B are enlarged cross-sectional views of part B of FIG. 2.

Referring to FIG. 1, the organic light-emitting display apparatus has a structure in which a display unit 140 that displays an image is provided on a substrate 130 and the thin film encapsulation layer 120 covers the display unit 140. Accordingly, the display unit 140 is encapsulated between the substrate 130 and the thin film encapsulation layer 120, and the thin film encapsulation layer 120 protects the display unit 140 from external moisture and air.

As shown in FIG. 2, the thin film encapsulation layer 120 has a structure in which a first inorganic film 121, an organic film 122, and a second inorganic film 123 are sequentially stacked, that is, organic and inorganic films are alternately stacked. In this regard, the first and second inorganic films 121 and 123 mainly prevent penetration of moisture, and the organic film 122 planarizes unevenness of a lower layer via fluidity thereof, and at the same time, provides flexibility to the thin film encapsulation layer 120.

In addition, the display unit 140 includes a thin film transistor 141 and an electroluminescence (EL) element 142. Regarding the thin film transistor 141, an active layer 141$f$ is on a buffer layer 141$a$ which is on the substrate 130, and has source and drain regions doped with an N-type or P-type impurity at a high concentration. The active layer 141$f$ may include an oxide semiconductor. For example, the oxide semiconductor may include an oxide of a material selected from Group 12, 13, and 14 metal elements such as zinc (Zn), indium (In), gallium (Ga), tin (Sn), cadmium (Cd), germanium (Ge), or hafnium (Hf) and a combination thereof. For example, the active layer 141$f$ may include G-I-Z-O[$(In_2O_3)_a(Ga_2O_3)_b(ZnO)_c$] (where a, b, and c are real numbers satisfying and a≥0, b≥0, c≥0, respectively). A gate electrode 141$g$ is above the active layer 141$f$ with a gate insulation layer 141$b$ therebetween. A source electrode 141$h$ and a drain electrode 141$i$ are above the gate electrode 141$g$. An interlayer insulation layer 141$c$ is between the gate electrode 141$g$ and the source and drain electrodes 141$h$ and 141$i$, and a passivation layer 141$d$ is between the source and drain electrodes 141$h$ and 141$i$ and an anode 142$a$ of the EL element 142.

An insulating planarization layer 141$e$ is on the anode 142$a$, and the EL element 142 is formed after an opening 142$d$ is formed in the planarization layer 141$e$, the insulating planarization layer 141$e$ including acryl.

The EL element 142, which displays predetermined image information by emitting red light, green light, and blue light according to a flow of electric current, includes the anode 142a connected to the drain electrode 141i of the thin film transistor 141 and receiving positive power therefrom, a cathode 142c covering all pixels and supplying negative power, and an emission layer 142b between the anode 142a and the cathode 142c and emitting light.

A hole injection layer (HIL), a hole transport layer (HTL), an electron transport layer (ETL), an electron injection layer (EIL), etc. may be stacked to the emission layer 142b.

For reference, the emission layer 142b may be separately formed with respect to each pixel so that pixels emitting red light, green light, and blue light collectively constitute one unit pixel. Alternatively, the emission layer 142b may be commonly formed over the entire pixel region regardless of the location of pixels. In this regard, the emission layer 142b may be formed by vertically stacking or combining layers including luminescent materials emitting, for example, red light, green light, and blue light. Any combination of other colors, which is capable of emitting white light, may be used. In addition, a color converting layer that converts the emitted white light into light of a predetermined color or a color filter may be further provided.

The emission layer 142b is highly vulnerable to moisture, and thus, when moisture contacts the display unit 140, emission performance may be degraded.

Accordingly, the display unit 140 is covered and protected by the thin film encapsulation layer 120 in which the first and second inorganic films 121 and 123 and the organic film 122 are alternately stacked as shown in the drawing.

As described above, the organic film 122 fills and planarizes unevenness of a lower layer via fluidity thereof, and to this end, requires a proper thickness. That is, a thickness of the organic film 122 has to be secured enough to fill and planarize unevenness of a lower layer, and when the thickness of the organic film 122 is not sufficient, an unfilled region not filled with the organic film 122 is likely to occur, which may cause a product defect. However, if the organic film 122 were unconditionally formed thick, bending or folding characteristics of organic light-emitting display apparatuses may be significantly degraded; therefore a proper condition for the thickness of the organic film 122 is required.

To resolve this problem, in the present embodiment, a roughness formed by scattering a plurality of protrusions over a surface of the first inorganic film 121 is formed as shown in FIGS. 3A and 3B. That is, there is an inversely proportional correlation between a minimum thickness of the organic film 122 whereby an unfilled region is not formed and a roughness of the first inorganic film 121 contacting the organic film 122, and accordingly, a desired thickness of the organic film 122 may be obtained by using the inversely proportional correlation.

As shown in FIGS. 3A and 3B, the first inorganic film 121 includes a base layer 121a and a surface layer 121b. The base layer 121a mainly performs a basic function of the first inorganic film 121, that is, prevents penetration of moisture and oxygen, and the surface layer 121b directly contacts the organic film 122 and provides a proper roughness condition.

In this regard, as a method of forming a roughness over the surface layer 121b, as shown in FIG. 3A, a roughness may be formed over the base layer 121a so that the surface layer 121b deposited thereon later may follow a roughness pattern of the base layer 121a as-is, or as shown in FIG. 3B, the surface layer 121b may have an independent roughness pattern regardless of the base layer 121a. Accordingly, when a roughness is formed over any one of the base layer 121a and the surface layer 121b, an overall surface roughness of the first inorganic film 121 may be formed.

Figure 4:
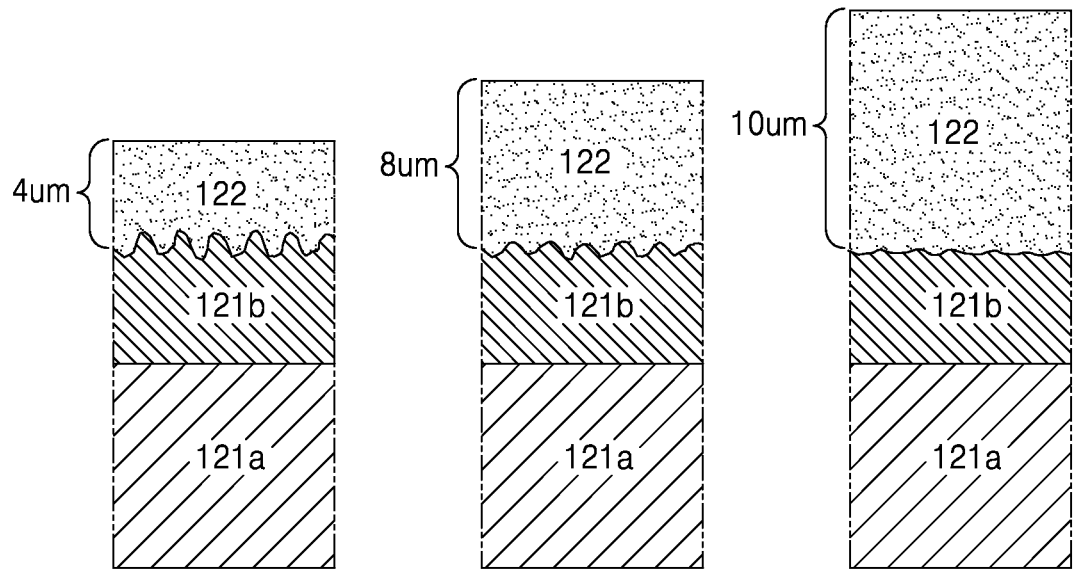
FIG. 4 is a cross-sectional view describing a correlation between a thickness of an organic film and a roughness of an inorganic film in a thin film encapsulation layer illustrated in FIGS. 3A and 3B.
Figure 5:
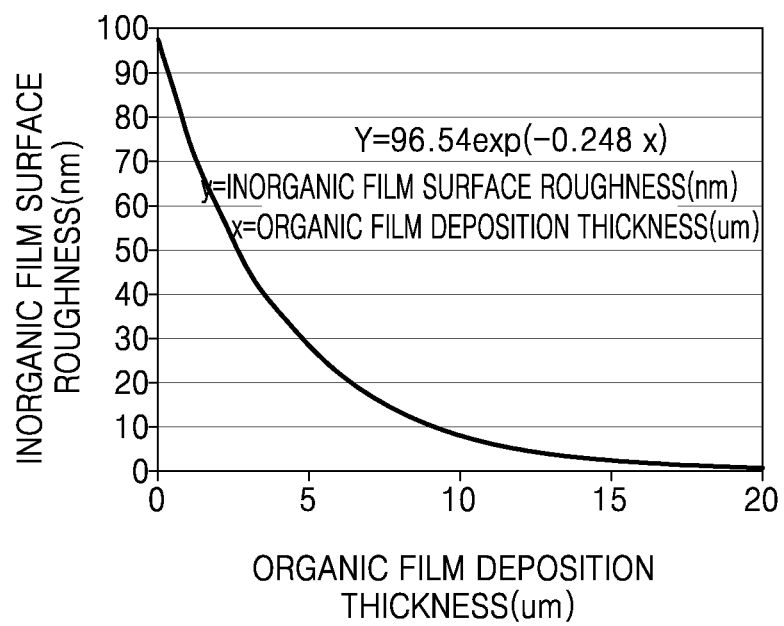
FIG. 5 is a graph illustrating the correlation described in FIG. 4.

It may be confirmed through an experiment that, as shown in FIGS. 4 and 5, there is an inversely proportional correlation in terms of an exponential function between the roughness of the first inorganic film 121 and the minimum thickness of the organic film 122 whereby an unfilled region is not formed.

That is, as a roughness of the surface layer 121b of the first inorganic film 121 directly contacting the organic film 122 increases, the organic film 122 spreads well, and thus, even if the organic film 122 is as thin as about 4 μm, an unfilled region is not formed. On the other hand, as the roughness of the surface layer 121b decreases, the organic film 122 does not spread well, and thus, a relatively sufficient thickness, for example, a thickness of about 10 μm, has to be secured to prevent formation of an unfilled region.

When such an experimentally obtained result is denoted by a graph, there is an inversely proportional correlation in terms of an exponential function as shown in FIG. 5, and the inversely proportional correlation may be, when represented by an equation, denoted by $Y=96.54 \exp(-0.248 \cdot X)$ [Y: surface roughness of the first inorganic film (nm), X: thickness of the organic film (μm)].

Accordingly, a surface roughness of the first inorganic film 121 for forming a desired thickness of the organic film 122 such that an unfilled region is not formed may be learned from the above correlation, and the correlation may be used to provide a stable manufacture condition for any thickness of the organic film 122.

For example, when the organic film 122 is to be formed to have a thickness of 8 μm, if a surface roughness of the first inorganic film 121, that is, a roughness of the surface layer 121b, is formed about 13 nm according to the correlation, an unfilled region may not be formed.

In addition, when the organic film 122 is to be formed as thick as 10 μm, even if the surface roughness of the first inorganic film 121 is formed about 8 nm, an unfilled region may not be formed. On the other hand, when the organic film 122 is to be formed as thin as 4 μm, the surface roughness of the first inorganic film 121 has to be formed about 35 nm to prevent formation of an unfilled region.

Accordingly, the surface roughness of the first inorganic film 121 may be adjusted according to a desired thickness of the organic film 122 to secure stable quality.

In general, a valid thickness of an organic film for a product of an organic light-emitting display apparatus ranges between 3 μm and 18 μm, and an effective roughness for preventing unfilling in this region ranges between 1 nm RMS and 50 nm RMS. Accordingly, when the roughness range is maintained, the occurrence of a defect due to unfilling of the organic film in the organic light-emitting display apparatus may be effectively controlled.

In this regard, RMS indicates a root mean square value of a centerline average roughness (Ra), and when the RMS is measured, an atomic force microscope (AFM) may be used. The AFM is a piece of equipment that measures a force between atoms by allowing a microprobe to approach a surface targeted for measurement to an atom size, and thus, measures a roughness therefrom.

The surface roughness of the first inorganic film 121 may be formed by processes shown in FIGS. 6A to 6D.

First, the base layer 121a and the surface layer 121b of the first inorganic film 121 including a material such as SiON are formed by a deposition method using plasma, and in this regard, radio frequency (RF) power for forming plasma and pressure of process gas may be controlled.

Figure 6A:
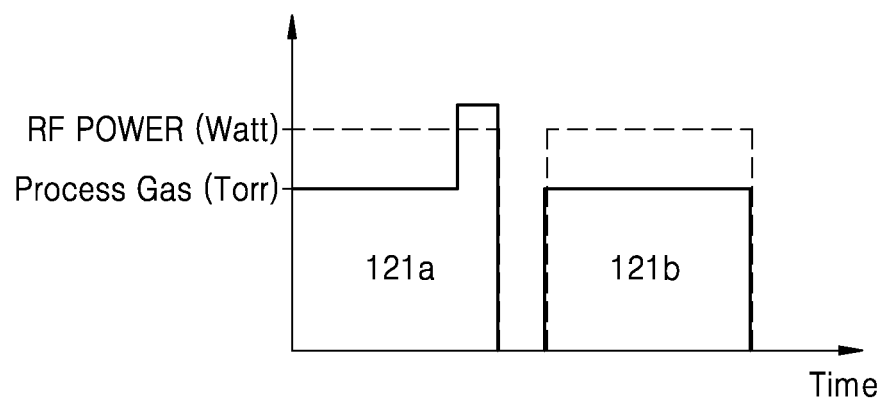
FIGS. 6A and 6B are graphs describing a deposition process for forming an inorganic film roughness of FIG. 3A.
Figure 6B:
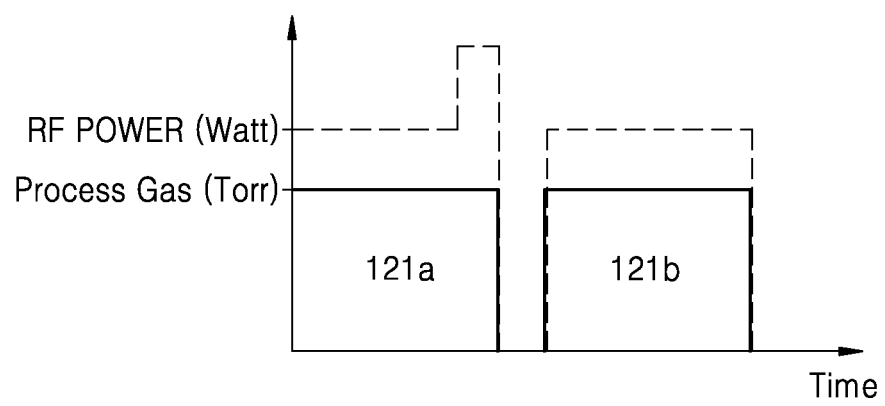

As shown in FIG. 3A, to form a desired roughness over the base layer 121a and transfer the roughness to the surface layer 121b as-is, before deposition of the base layer 121a is finished, pressure of process gas is increased as shown in FIG. 6A, or RF power is increased as shown in FIG. 6B. Then, as an amount of deposition suddenly increases at a finishing step of the base layer 121a, a plurality of protrusions are formed over a surface of the base layer 121a, and the surface becomes rough. That is, roughness increases.

Figure 6C:
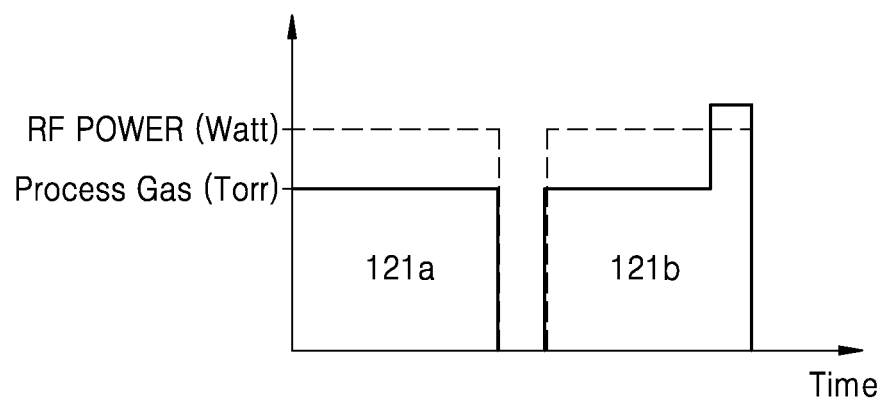
FIGS. 6C and 6D are graphs describing a deposition process for forming an inorganic film roughness of FIG. 3B.
Figure 6D:
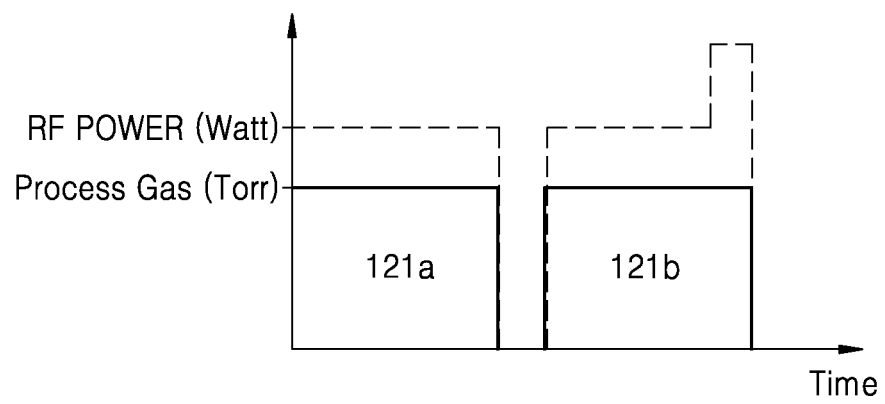

In addition, as shown in FIG. 3B, to directly form a desired roughness over the surface layer 121b, before deposition of the surface layer 121b is finished, pressure of process gas is increased as shown in FIG. 6C, or RF power is increased as shown in FIG. 6D. Then, as an amount of deposition suddenly increases at a finishing step of the surface layer 121b, a plurality of protrusions are formed over a surface of the surface layer 121b, and the surface becomes rough, thereby increasing roughness.

Therefore, while the surface roughness of the first inorganic film 121 is adjusted by using the above method, a desired thickness of the organic film 122 may be stably obtained.

Meanwhile, the surface roughness of the first inorganic film 121 may also be formed by processes of scattering fine particles P as shown in FIGS. 7A to 7D.

Figure 7A:
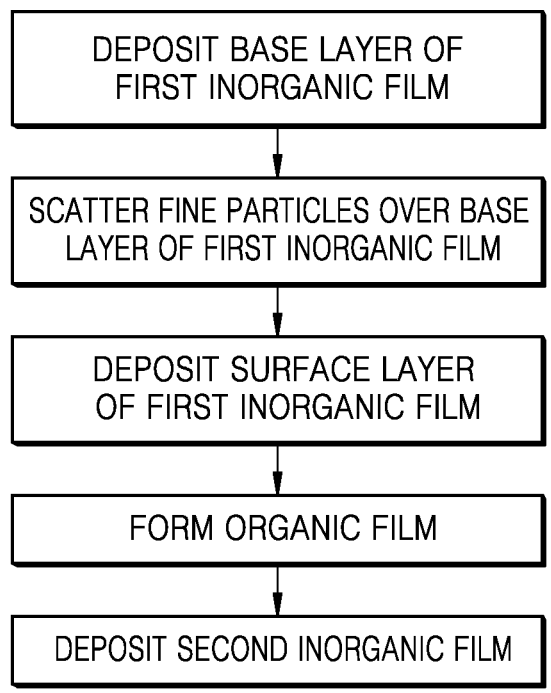
FIGS. 7A, 7B, 7C and 7D are flowcharts and cross-sectional views describing modified examples in which a roughness is formed over an inorganic film by adding fine particles in addition to a deposition process.
Figure 7B:
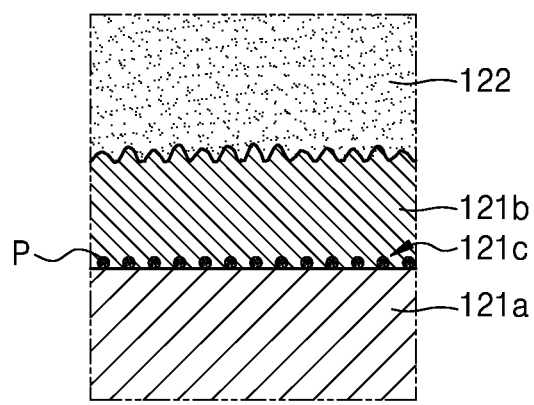

As shown in FIG. 3A, to form a desired roughness over the base layer 121a and transfer the roughness to the surface layer 121b as-is, the base layer 121a is deposited as shown in FIGS. 7A and 7B, and then, a roughness auxiliary layer 121c is formed by scattering fine particles P over a surface thereof. Next, when the surface layer 121b is formed, a plurality of protrusions are formed over the surface layer 121b along distribution of the fine particles P in the roughness auxiliary layer 121c, and thus, roughness is formed. Accordingly, roughness may be controlled by adjusting a size and an amount of the fine particles P.

Figure 7C:
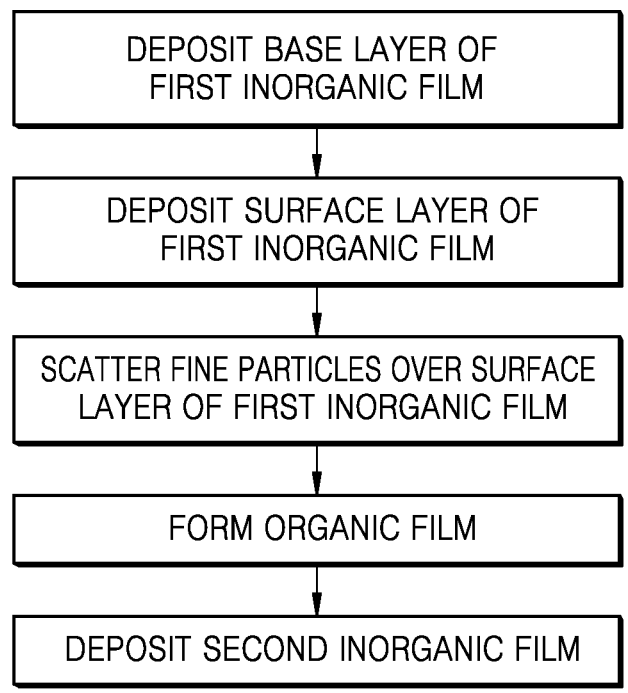
Figure 7D:
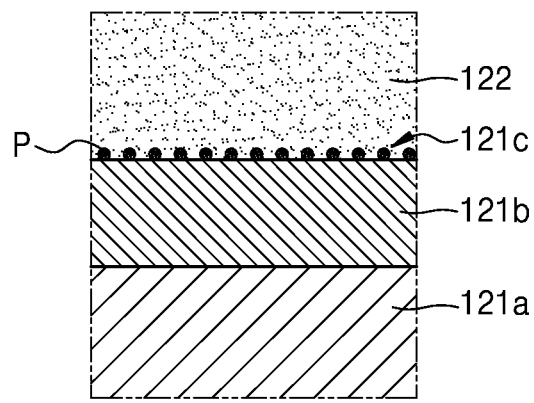

In addition, as shown in FIG. 3B, to directly form a desired roughness over the surface layer 121b, the roughness auxiliary layer 121c is formed by scattering the fine particles P over the surface layer 121b, as shown in FIGS. 7C and 7D. Accordingly, roughness of the surface layer 121b may be directly controlled by adjusting a size and an amount of the fine particles P.

By using the above method, roughness of the first inorganic film 121 may be smoothly controlled, and thus, a thickness of the organic film 122 may be stably formed according to a desired standard. After the organic film 122 is formed, the display unit 140 is further stably protected by forming the second inorganic film 123, as shown in FIGS. 2 to 3B.

The thickness of the organic film 122 indicates an average thickness corresponding to a gap between the first inorganic film 121 and the second inorganic film 123, and a very small deviation due to unevenness of a lower layer of the organic film 122 is regarded as being included in a margin of error.

Therefore, according to an organic light-emitting display apparatus having the structure described above and a method of manufacturing the organic light-emitting display apparatus, a thickness of an organic film of a thin film encapsulation layer may be variously increased or decreased, and at the same time, formation of an unfilled region may be sufficiently controlled. Accordingly, various demands for the thickness of the organic film may be smoothly handled, and thus, reliability of a product may be significantly increased.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a substrate;
   a display unit on the substrate; and
   a thin film encapsulation layer covering the display unit,
   wherein the thin film encapsulation layer comprises:
      a first inorganic film on the display unit; and
      an organic film on the first inorganic film,
   wherein a plurality of protrusions are distributed over a surface of the first inorganic film contacting the organic film, the plurality of protrusions provide a surface roughness of the first inorganic film, and
   wherein the surface roughness of the first inorganic film and a thickness of the organic film satisfy a condition of $Y=96.54 \exp(-0.248-X)$, where Y is the surface roughness of the first inorganic film in nm and X is the thickness of the organic film in μm.

2. The organic light-emitting display apparatus of claim 1, wherein a surface roughness of the first inorganic film ranges between 1 nm RMS and 50 nm RMS due to the plurality of protrusions.

3. The organic light-emitting display apparatus of claim 2, wherein the first inorganic film comprises a base layer contacting the display unit, and a surface layer on the base layer,
   wherein the surface layer contacts the organic film and is an object of the surface roughness.

4. The organic light-emitting display apparatus of claim 3, wherein the surface roughness of the surface layer comprises a same pattern as a roughness of the base layer.

5. The organic light-emitting display apparatus of claim 4, wherein the roughness of the base layer is determined by an uneven state of a body surface of the base layer.

6. The organic light-emitting display apparatus of claim 4, further comprising a roughness auxiliary layer comprising fine particles distributed over the base layer,
   wherein the roughness of the base layer is determined by the fine particles of the roughness auxiliary layer.

7. The organic light-emitting display apparatus of claim 3, wherein the surface layer comprises an independent surface roughness comprising a different pattern from roughness of the base layer.

8. The organic light-emitting display apparatus of claim 7, wherein the surface roughness of the surface layer is determined by an uneven state of a body surface of the surface layer.

9. The organic light-emitting display apparatus of claim 7, further comprising a roughness auxiliary layer comprising fine particles distributed over the surface layer,
   wherein the surface roughness of the surface layer is determined by the fine particles of the roughness auxiliary layer.

10. The organic light-emitting display apparatus of claim 1, wherein the thin film encapsulation layer further comprises a second inorganic film on the organic film.

\* \* \* \* \*